(12) United States Patent
Curtis

(10) Patent No.: US 9,494,634 B2
(45) Date of Patent: Nov. 15, 2016

(54) CURRENT TESTER

(71) Applicant: Kevin M. Curtis, Locust, NC (US)

(72) Inventor: Kevin M. Curtis, Locust, NC (US)

( * ) Notice: Subject to any disclaimer, the term of this patent is extended or adjusted under 35 U.S.C. 154(b) by 107 days.

(21) Appl. No.: 14/271,542

(22) Filed: May 7, 2014

(65) Prior Publication Data
US 2014/0340094 A1  Nov. 20, 2014

Related U.S. Application Data

(60) Provisional application No. 61/855,654, filed on May 20, 2013.

(51) Int. Cl.
*G01R 19/15* (2006.01)
*G01R 31/00* (2006.01)

(52) U.S. Cl.
CPC .............. *G01R 31/006* (2013.01); *G01R 19/15* (2013.01)

(58) Field of Classification Search
CPC .............................. G01R 19/15; G01R 31/006
USPC ......................................................... 324/503
See application file for complete search history.

(56) References Cited

U.S. PATENT DOCUMENTS

| | | | | |
|---|---|---|---|---|
| 8,203,345 B2 * | 6/2012 | Bertness | ............ | G01R 31/3637 324/156 |
| 2005/0017726 A1 * | 1/2005 | Koran | .................. | G01R 31/007 324/433 |
| 2005/0206367 A1 * | 9/2005 | Krieger | .............. | G01R 19/0092 324/115 |
| 2008/0224710 A1 * | 9/2008 | Henningson | ..... | G01R 19/16542 324/433 |
| 2011/0175699 A1 * | 7/2011 | Huss | ...................... | H01H 85/32 337/143 |
| 2013/0221973 A1 * | 8/2013 | Whisenand | ........ | G01R 31/1272 324/501 |

* cited by examiner

*Primary Examiner* — Son Le
*Assistant Examiner* — Akm Zakaria
(74) *Attorney, Agent, or Firm* — Hammer & Associates, P.C.

(57) ABSTRACT

A current tester includes: a probe, a computing device for converting a voltage drop across a component to a current, and an output device for signaling a presence or non-presence of current. The computing device stores a predetermined voltage drop/current relationship for the component. A method for detecting current in a circuit includes: connecting a current tester to the component, measuring a voltage drop across the component, converting the voltage drop to a current via the current tester, and producing a signal by the current tester indicating a presence or non-presence of current in the circuit. A method for detecting current in a circuit may also comprises: connecting probes of a testing device to a component in the circuit; determining via whether the probes are properly connected to the component; and determining a voltage drop across the component to determine the presence or non-presence of current.

12 Claims, 8 Drawing Sheets

CURRENT TESTER

RELATED APPLICATION

This application claims the benefit of U.S. provisional patent application Ser. No. 61/855,654 filed May 20, 2013, incorporated herein by reference.

FIELD OF THE INVENTION

This invention is directed to a current testing device and methods for its use, particularly for use in automotive diagnostics.

BACKGROUND OF THE INVENTION

As known by those skilled in the art, voltage drop is measured, with a volt meter, in parallel with a component, while current passing through that component is measured, with an amp meter, in series with the component.

Current leaks, sometimes called "parasitic leaks," are bad for circuits. Those leaks can cause an unnecessary drain on the power source for the circuit. Moreover, finding those leaks can be difficult, particularly if the space around the circuit is limited, making the use of the amp meter difficult.

For example, a parasitic leak in an automotive circuit can result in a dead battery. To locate the leak, typically, requires that the technician remove a fuse, connect the amp meter to the circuit, energize the circuit, and then test the circuit to determine the presence or non-presence of current. This process is time consuming. Moreover, the space around the automotive fuse panel is limited, so it can be difficult to get the amp meter in position to perform the test.

Accordingly, there is a need for a more convenient device and method for testing current flowing through a circuit.

SUMMARY OF THE INVENTION

A current tester includes: a probe, a computing device for converting a voltage drop across a component to a current, and an output device for signaling a presence or non-presence of current. The computing device stores a pre-determined voltage drop/current relationship for the component. A method for detecting current in a circuit includes: connecting a current tester to the component, measuring a voltage drop across the component, converting the voltage drop to a current via the current tester, and producing a signal by the current tester indicating a presence or non-presence of current in the circuit. A method for detecting current in a circuit may also comprises: connecting probes of a testing device to a component in the circuit; determining via whether the probes are properly connected to the component; and determining a voltage drop across the component to determine the presence or non-presence of current.

DESCRIPTION OF THE DRAWINGS

For the purpose of illustrating the invention, there is shown in the drawings a form that is presently preferred; it being understood, however, that this invention is not limited to the precise arrangements and instrumentalities shown.

DESCRIPTION OF THE INVENTION

Figure 1:
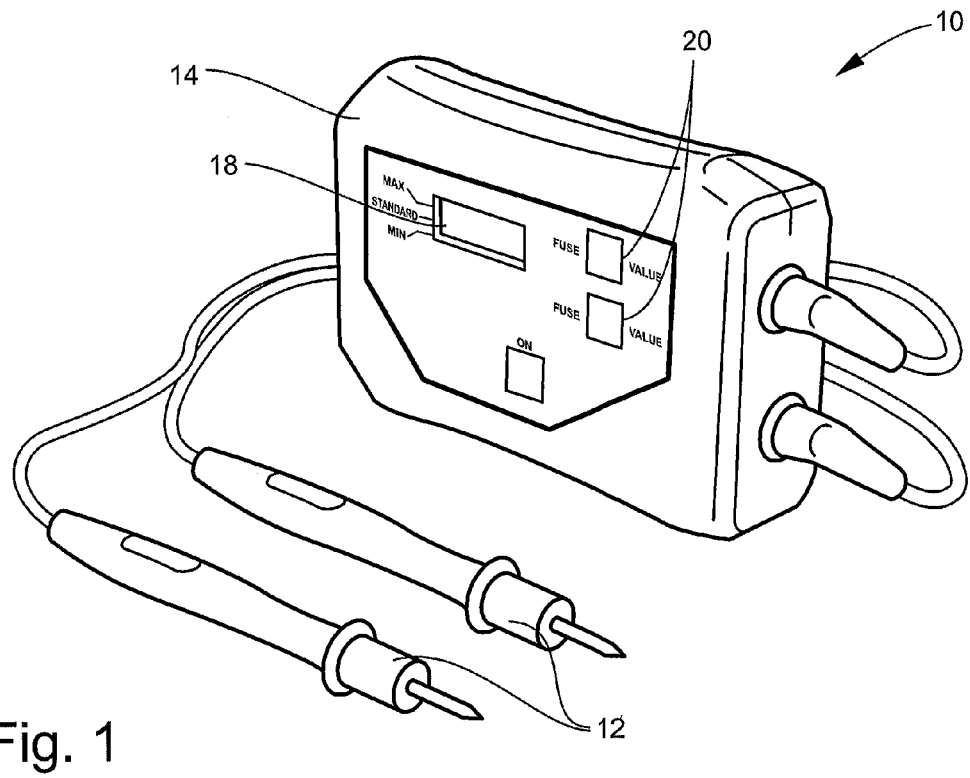
FIG. 1 is an illustration of an embodiment of the tester.

Referring to the drawings, where like elements have like numerals, there is shown in FIG. 1 an embodiment of the current tester 10. Current tester 10 generally includes probes 12, and a housing 14. Within the housing 14 may be a computing device 16 (not shown), an output device 18 (only visual output shown), and optionally, an input device 20 (discussed in greater detail below). In one mode of operation, the current tester 10 measures the voltage drop across a component of the circuit and then the computing device translates the voltage drop for the component to a current based on a pre-determined relationship of voltage drop/current for that component. To simplify the following discussion, the current tester 10 will be illustrated as a current tester for an automotive circuit, it being understood that the tester is not so limited and the tester may be used in other applications as will be readily apparent to those of ordinary skill. Moreover, in this simplification, the component of the automotive circuit may be a fuse. Of course, the component is not limited to a fuse, but using the procedure outlined below any component may be used.

Figure 2:
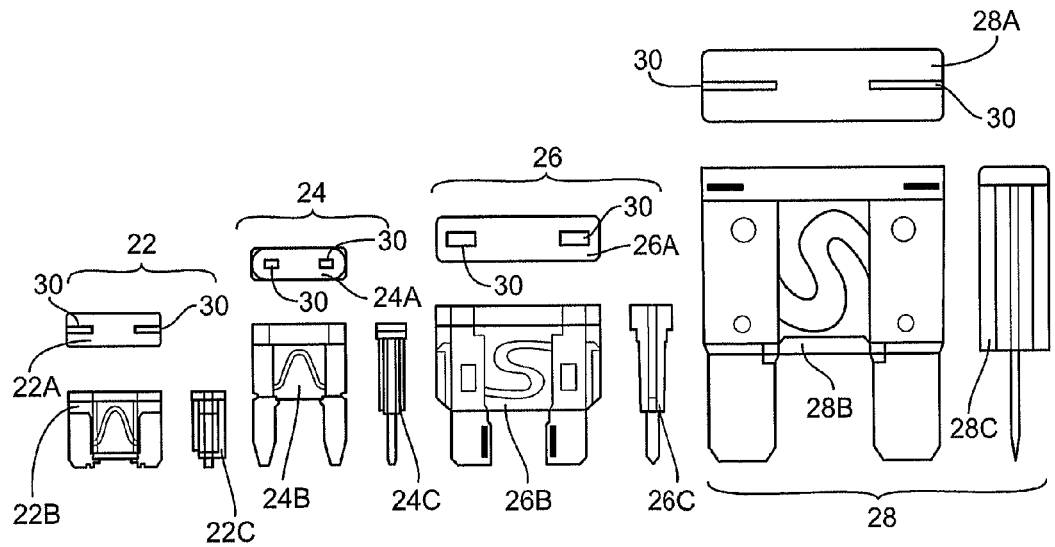
FIG. 2 is an illustration of several views of various automotive fuses.

In FIG. 2, there is shown four conventional automotive fuses (each is shown in top plan view—A, elevational view—B, and side elevational view—C). Fuse 22 is conventionally called a "low-profile mini" fuse. Fuse 24 is conventionally called a "mini" fuse. Fuse 26 is conventionally called an "ATO" fuse. Fuse 28 is conventionally called a "maxi" fuse. Each of these fuses are generally the same with blades for insertion into a fuse box so that the fuse can protect the circuit from damaging currents, a fuse element connecting the blades, and contact surfaces 30 (best seen in the top plan views A of each fuse) which may be a portion of the blades.

Each of these fuses is a precision component that has a very defined and reproducible resistance over a given current range. That resistance is useful in determining the voltage drop/current relationship for the component (or fuse). For example, one may determine the voltage drop/current relationship by inputting a known current through the component and measuring the voltage drop corresponding to that current. If many of these points are determined over a range of currents, then a line may be drawn to show the relationship of current to voltage drop for a given component over the range of currents. That line may then be translated to a mathematical equation (for example, by regression analysis) or defined in a look-up table.

Figure 3:
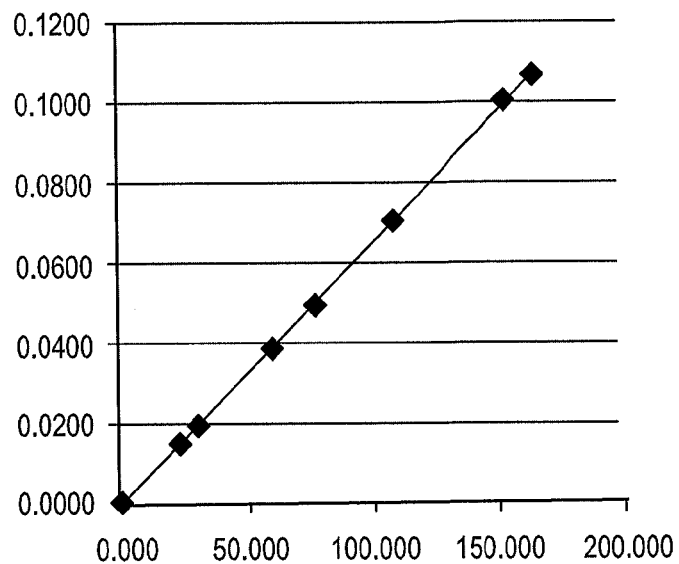
FIG. 3 is a graph illustrating a voltage drop/current relationship (low current range) of a component.
Figure 4:
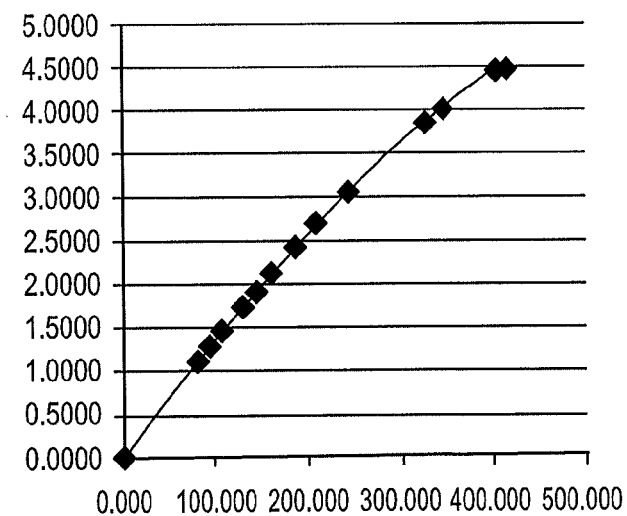
FIG. 4 is a graph illustrating a voltage drop/current relationship (high current range) of the component shown in FIG. 3.

In one embodiment, the voltage drop/current relationship for a 5 amp mini fuse is shown in FIGS. 3 and 4. FIG. 3 shows the relationship over the range of 0.0-0.12 amps (increments of 0.01 amps). FIG. 4 shows the relationship over the range of 0.0-5.0 amps (increments of 0.1 amps). In both figures, the Y-axis is the amperage, while the X-axis represents the voltage drop (after amplification and converting to a digital value). The amperage ranges overlap and the choice of which relationship is used may be based upon limits of the sample taken at the time of sampling.

Since, the tester, in one embodiment, may be used to detect parasitic leaks (low current), it may be best to use multiple current ranges. Any number of ranges may be possible. As shown above, two ranges are used. In the lower range (0.0-0.12 amps), a high resolution may be more desirable than in the upper range (0.0-5.0 amps). To obtain the higher resolution, a higher gain amplifier may be used in the lower range than is used in the upper range (i.e., Gain-lower amp range>Gain-upper amp range).

The probes 12 may be any probes that are capable of interconnecting the component to the tester 10 (or more precisely the computing device housed in the tester 10). In one embodiment, the probe may include a lead, a wire (or cable), and a plug (shown in FIG. 1). But, the probe may be wireless, that is the lead is interconnected to the tester via, for example, radio frequency (RF) signals. The probe may also clip-on to the component, so that hands-free operation may be realized.

The output device 18 may be included with the housing 14 of the tester 10. Output device 18 is operatively connected to the computing device 16 (discussed below). Output device 18 is for signaling the presence or non-presence of a current in the circuit. The output device 18 may include a visual display (e.g., light or readable display), an audible tone, or both. In one embodiment, the output device may signal the absence or presence of the component (e.g., fuse).

The input device 20 may be included with the housing 14. Input device 20 is operatively connected to the computing device 16 (discussed below). Input device 20 is for setting the computing device 16 for the component around which current is being measured by voltage drop across that component. Input device may include a switch, or button, or display or all three through which the technician informs or sets the computing device to the correct (or proper) pre-determined voltage drop/current relationship.

The technician may input a parameter to specific the component. Any parameter may be used to identify the component. In the case of a fuse, the parameter may be, by way of non-limiting example, a type (or style), or an amperage rating. As mentioned above, automotive fuses may include low-profile mini, mini, ATO or maxi. Amperage rating for automotive fuses may be 5, 7.5, 10, 15, 20, 25, 30, 40, 50, and 60.

Figure 5:
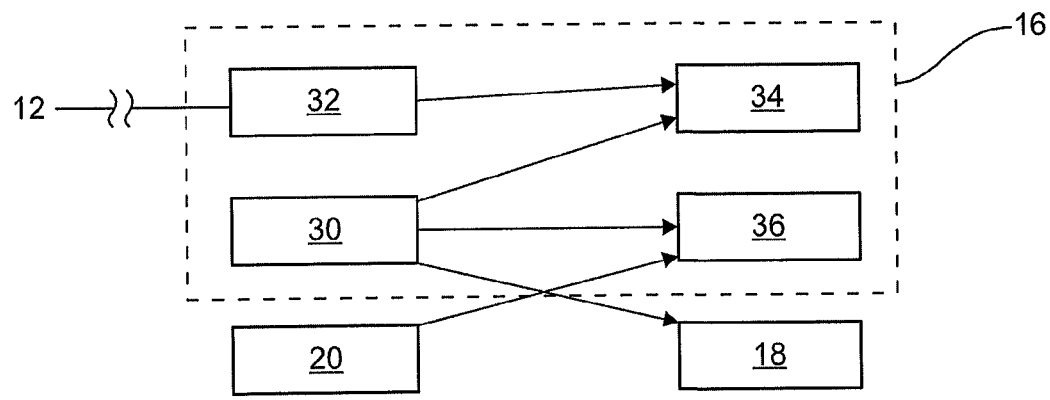
FIG. 5 is a schematic illustration of an embodiment of the tester.

The computing device 16 is located within housing 14 and is operatively connected to the probes 12, the output device 18 and the input device 18. FIG. 5 shows a block diagram of one embodiment of the computing device 16 (within the phantom line) coupled with the probes 12, the output device 18, and the input device 20. The computing device 16 may include; a power source 30, an amplifier 32, an analog/digital converter 34, and a microprocessor 36.

Power source 30 may be any power source capable of supplying power to the amplifier 32, the converter 34, the microprocessor 36, and the input and output devices 20/18. Power source 30 is operatively connected to the amplifier 32, the converter 34, the microprocessor 36, and the input and output devices 20/18.

Amplifier 32 is for amplifying the signal from the probes 12.

Analog/digital converter 34 (e.g., 10 bit) is for converting the analog signal from the amplifier 32 into a digital signal for input to the microprocessor 36.

Microprocessor 36 may include the following operations: 1) storing the pre-determined voltage drop/current relationships, 2) selecting the proper relationship based on input from the input device 20, 3) determining the current based upon the signal (e.g., voltage drop across the component) from the probes using the properly selected relationship, 4) outputting the message via the output device 18, and 5) sensing a ground produced by the computing device on one lead of the probe to a ground at the other lead of the probe to determine whether the probe is properly connected to the component. Additionally, the microprocessor may detect and signal a change in the current passing through the component and continuously output current passing through the component.

Figure 6A:
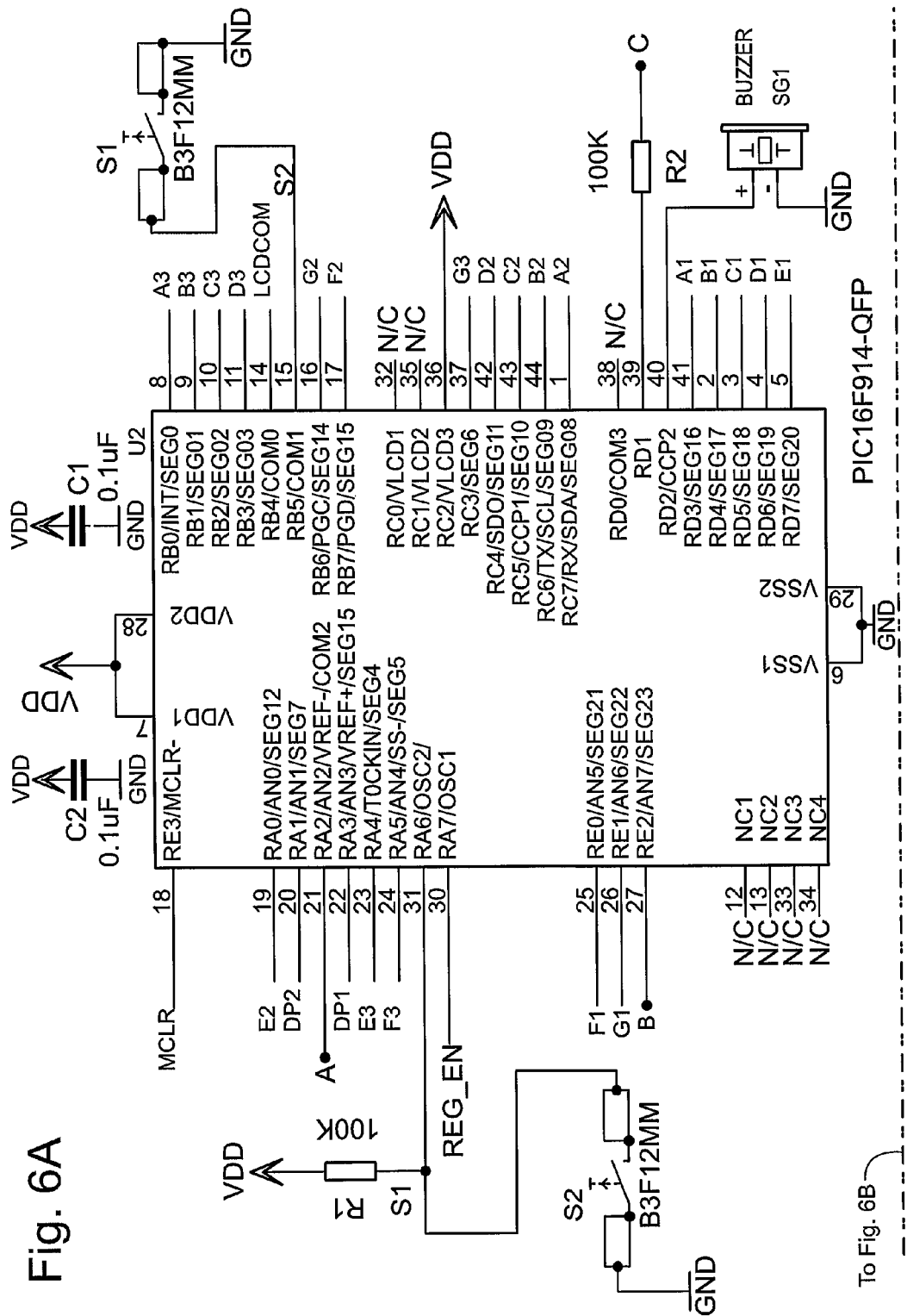
FIGS. 6A and 6B are is a schematic illustration of the electronics (part 1) of an embodiment of the current tester.
Figure 6B:
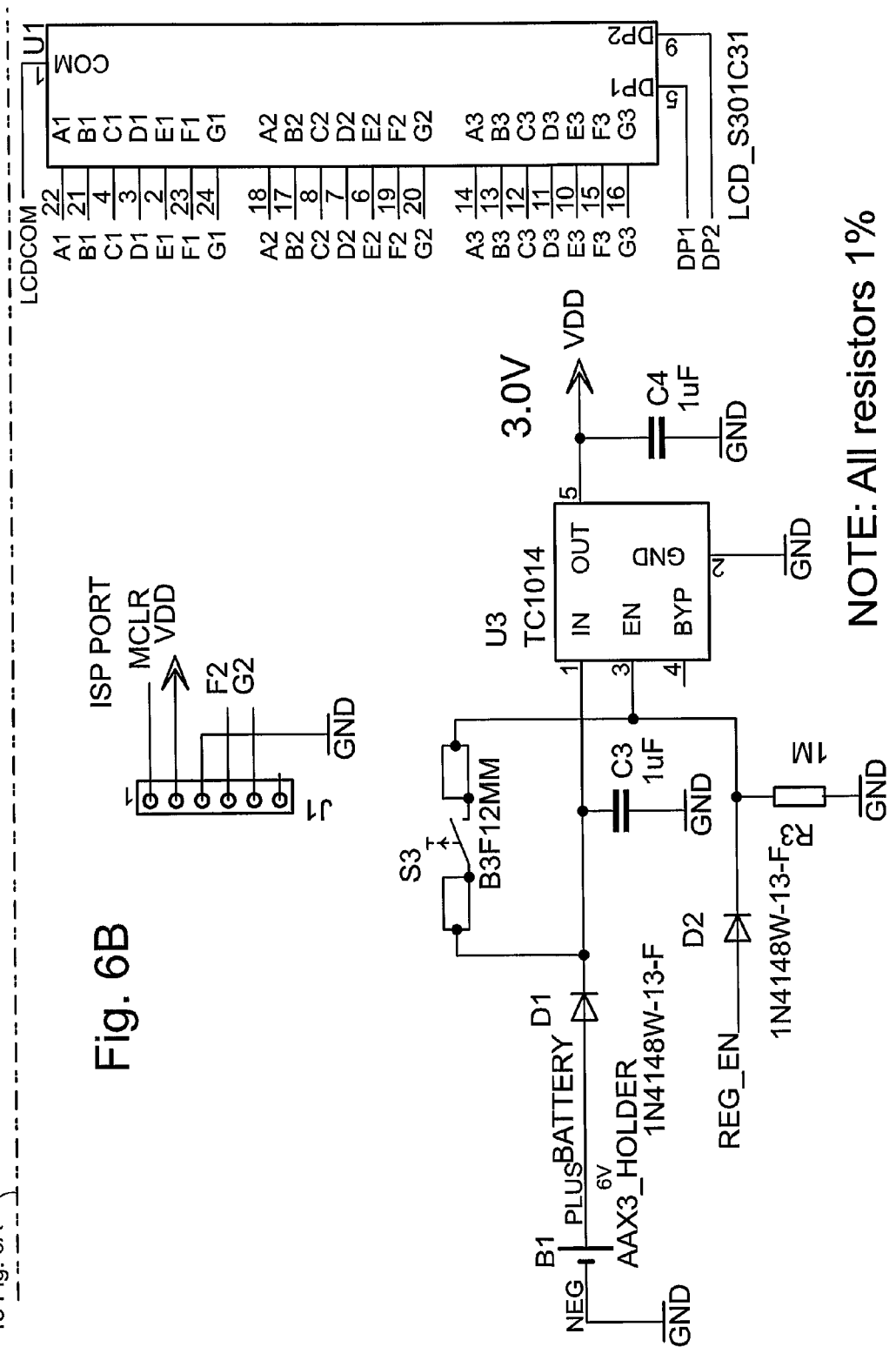
Figure 7:
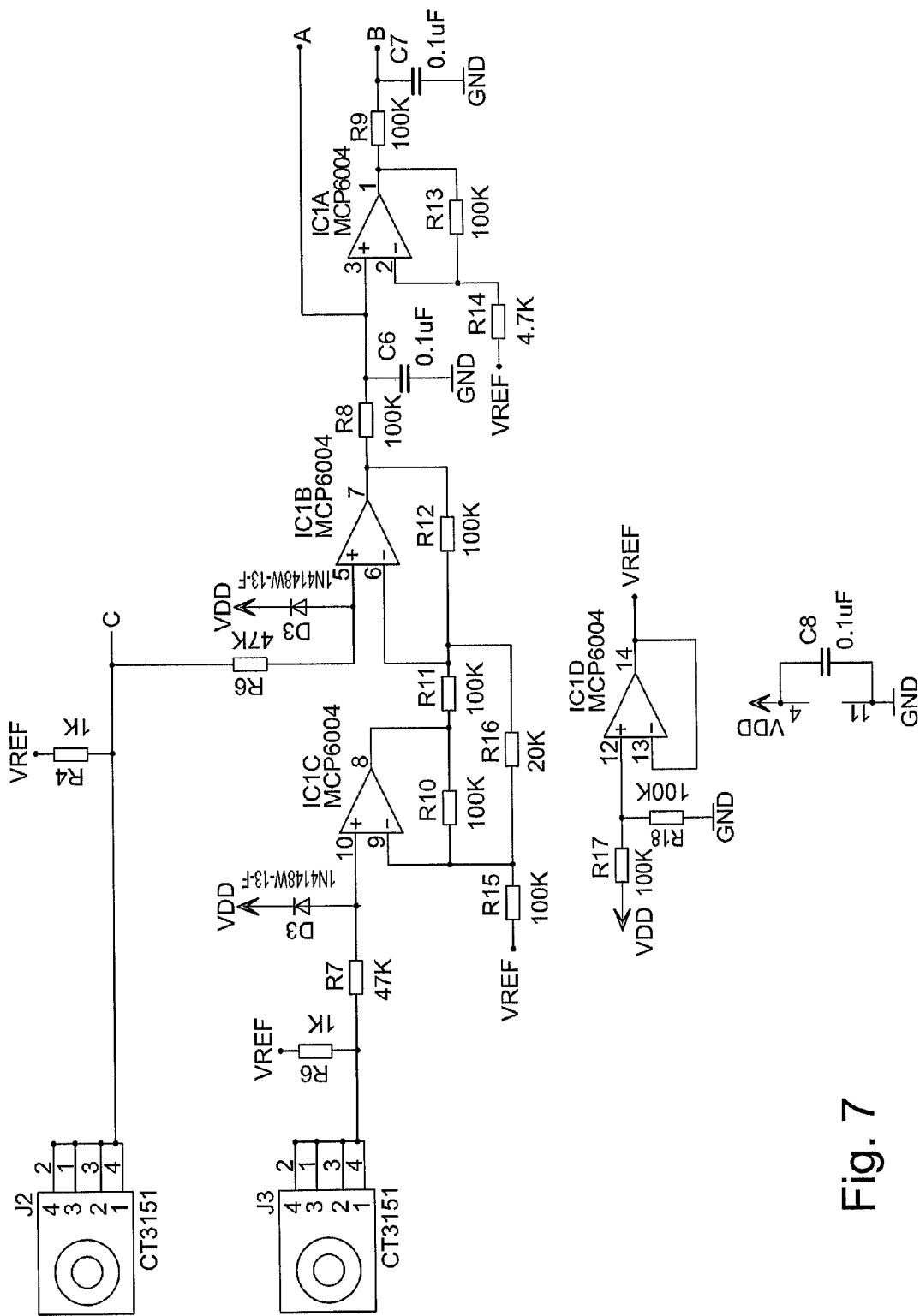
FIG. 7 is a schematic illustration of the electronics (part 2) of an embodiment of the current tester.

One embodiment of the current tester 20 is illustrated in the schematics shown in FIGS. 6 and 7.

Figure 8:
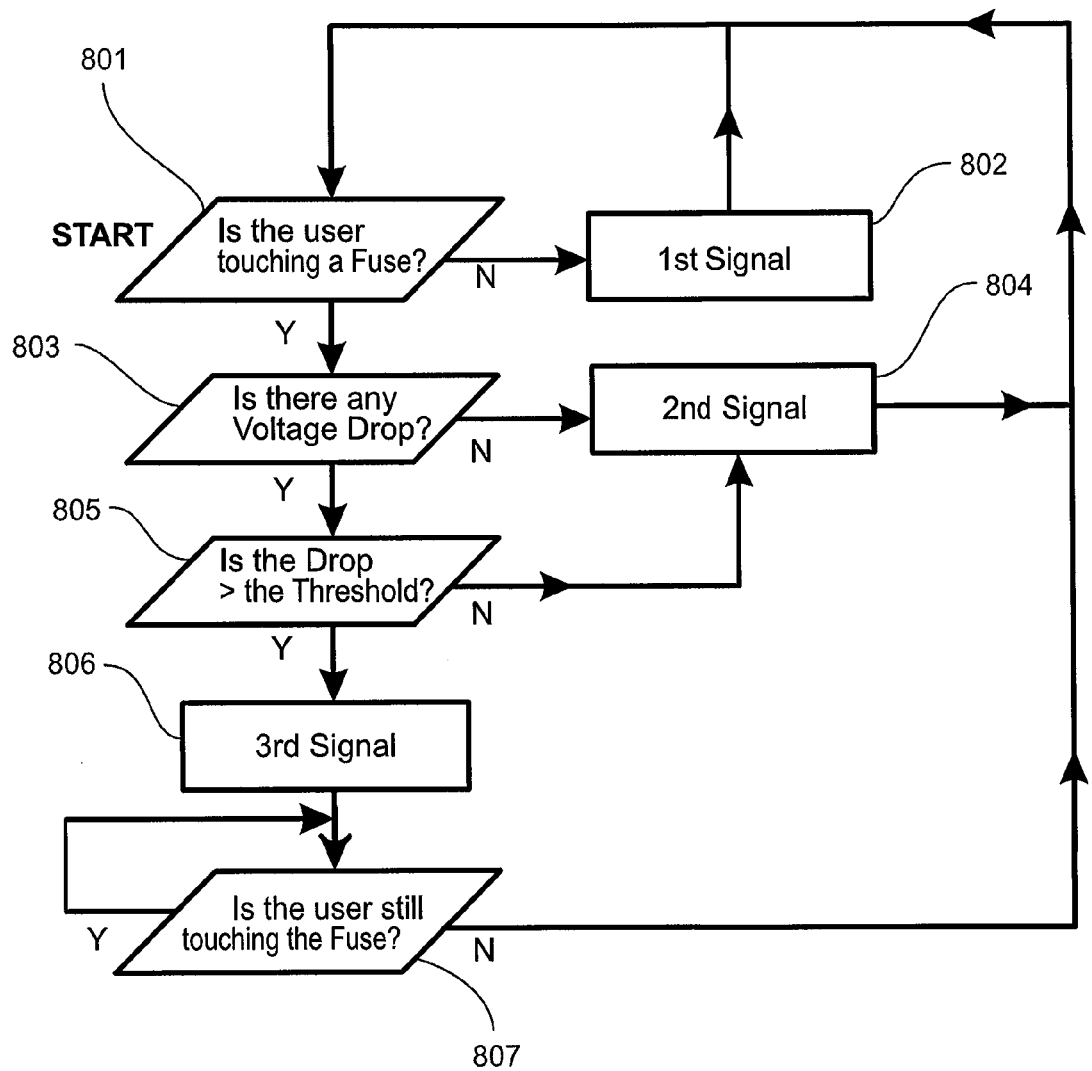
FIG. 8 is an illustration of the algorithm (flow chart) showing one configuration of the current tester.
Figure 9:
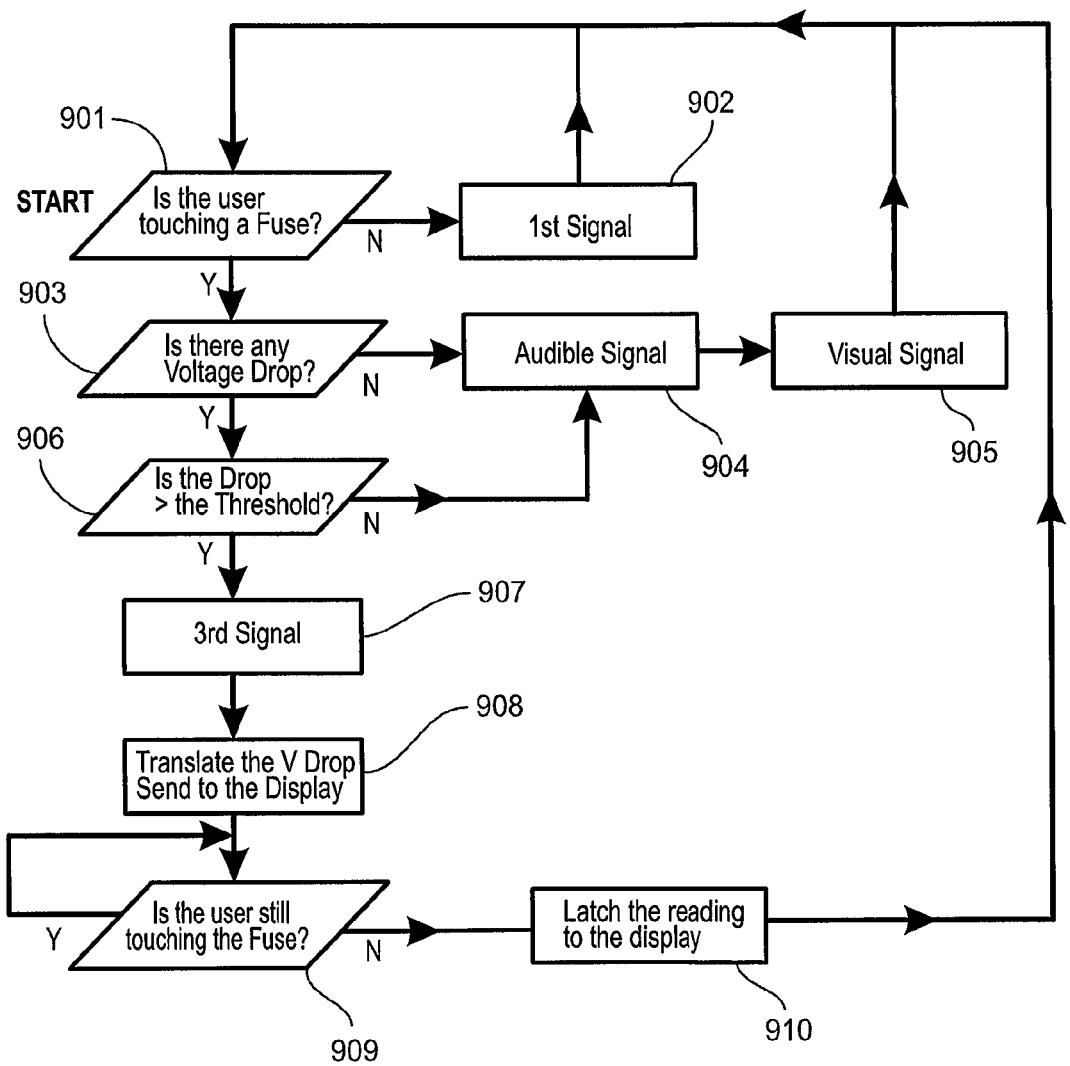
FIG. 9 is an illustration of the algorithm (flow chart) showing another configuration of the current tester.
Figure 10:
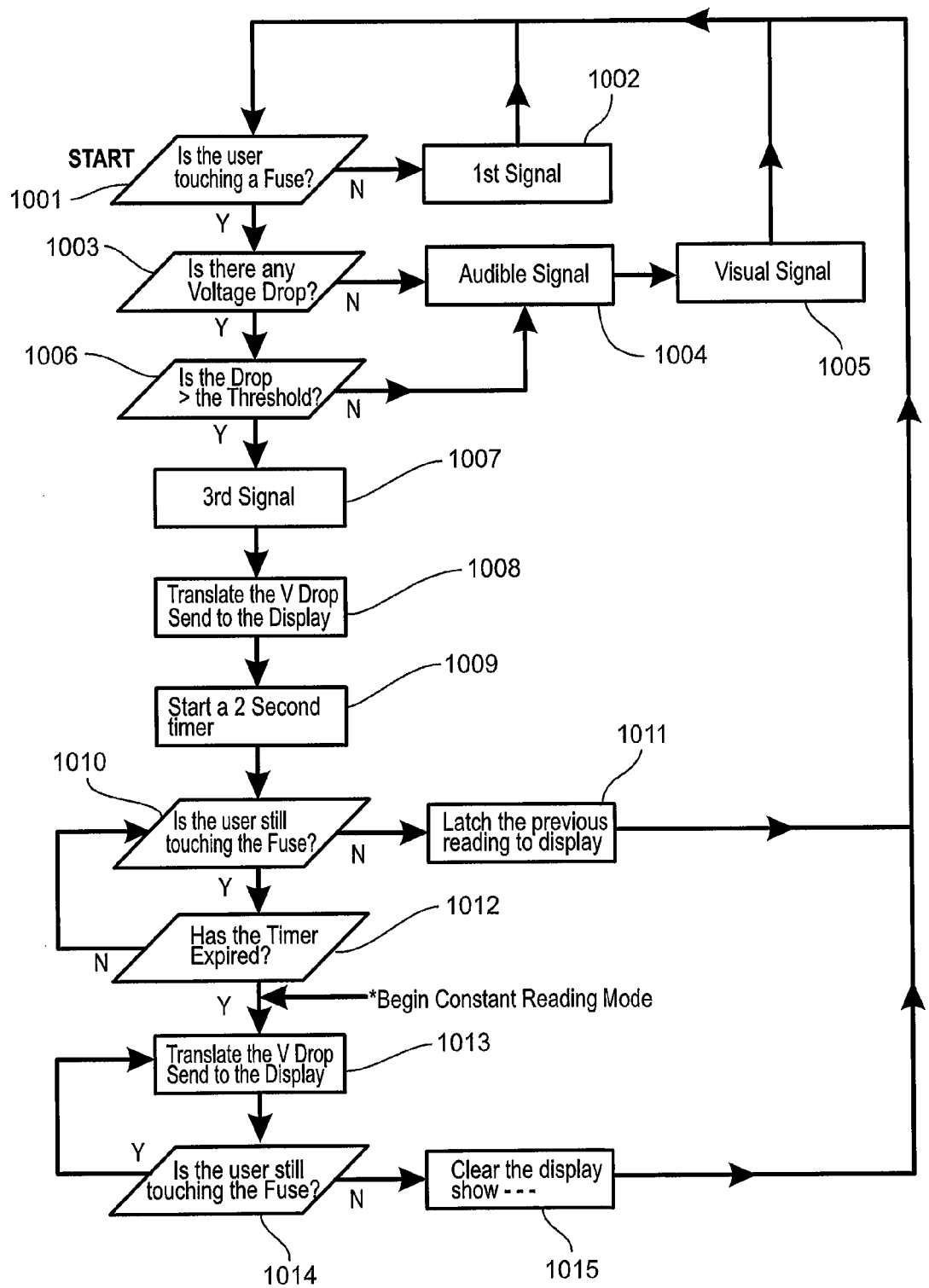
FIG. 10 is an illustration of the algorithm (flow chart) showing yet another configuration of the current tester.

Referring to FIGS. 8-10, several modes of operating the current tester are illustrated.

In FIG. 8, the tester is configured to detect the presence or non-presence of a sufficient current flowing through the circuit. This configuration may be used to determine if the component is operational, e.g., is the fuse blown. In 801, the technician connects the probes of the tester to the component, connection is parallel to the component and component has not been removed from the circuit. If the probes are improperly connected to the component, the computing device senses the improper connection and produces a first signal 802 (e.g., no tone). In one embodiment, the computing device senses the propriety of the connection by creating a signal (e.g., a ground, or a temporary or momentary ground) at one lead of the probes and the other lead looks for that signal. If the probes are properly connected, the computing device then determines whether there is a voltage drop across the component, 803. If there is no voltage drop, the computing device produces a second signal, 804 (e.g., a steady tone). If there is a voltage drop, the computing device compares the measured voltage drop to a stored pre-determined (threshold) voltage drop, 805. If the measured voltage drop is less than the pre-determined voltage drop, the computing device produces the second signal, 804. If the measured voltage drop is greater than the pre-determined voltage drop, the computing device produces a third signal, 806 (e.g., beeps or three (3) beeps). The pre-determined voltage drop may be any voltage drop. In automotive testing, particularly across a fuse, the pre-determined voltage drop may be about 80 micro volts (μV). Thereafter, the tester determines whether the tester is connected or not to the component and repeats, as indicated.

In FIG. 9, the tester is configured to detect the presence or non-presence of a current flowing through the circuit and display the current measured when detected. This configuration may be used to determine if a current (e.g., any current including a parasitic leak) is present in the circuit. In 901, the technician connects the probes of the tester to the component, connection is parallel to the component and component has not been removed from the circuit. If the probes are improperly connected to the component, the computing device senses the improper connection and produces a first signal 902 (e.g., no tone). In one embodiment, the computing device senses the propriety of the connection by creating a signal (e.g., a ground, or a temporary or momentary ground) at one lead of the probes and the other lead looks for that signal. The determination of the propriety of the connection is optional in this configuration. If the probes are properly connected, the computing device then determines whether there is a voltage drop across the component, 903. If there is no voltage drop, the computing device produces a second signal, 904 and/or 905 (e.g., an audible steady tone 904 or a visual display 905, e.g., 000). If there is a voltage drop, the computing device determines 906 whether that voltage drop is greater than the threshold voltage drop (discussed above). Step 906 is optional. If there is a voltage drop, the computing device produces a third signal 907 (e.g., beeps or three (3) beeps). The computing device then translates 908 the measured voltage drop to a current using the stored pre-determined voltage drop/current relationship and outputs the calculated current to a visual display. Before, translating the voltage drop to current, the technician may then inputs a parameter of the component into the computing device (step not shown). Thereafter, the tester determines 909 whether the tester is connected or not to the component and repeats, as indicated. The calculated current is displayed 910.

In FIG. 10, the tester is configured to detect the presence or non-presence of a current flowing through the circuit and display the current measured periodically while the tester is connected to the component. This configuration may be used to determine current change in the circuit. In 1001, the technician connects the probes of the tester to the component, connection is parallel to the component and component has not been removed from the circuit. If the probes are improperly connected to the component, the computing device senses the improper connection and produces a first signal 1002 (e.g., no tone). In one embodiment, the computing device senses the propriety of the connection by creating a signal (e.g., a ground, or a temporary or momentary ground) at one lead of the probes and the other lead looks for that signal. The determination of the propriety of the connection is optional in this configuration. If the probes are properly connected, the computing device then determines whether there is a voltage drop across the component, 1003. If there is no voltage drop, the computing device produces a second signal, 1004 and/or 1005 (e.g., an audible steady tone 1004 or a visual display 1005, e.g., 000). If there is a voltage drop, the computing device determines 1006 whether that voltage drop is greater than the threshold voltage drop (discussed above). Step 1006 is optional. If there is a voltage drop, the computing device produces a third signal 1007 (e.g., beeps or three (3) beeps). The computing device then translates 1008 the measured voltage drop to a current using the stored pre-determined voltage drop/current relationship and may output the calculated current to a visual display. Before, translating the voltage drop to current, the technician inputs a parameter of the component into the computing device (step not shown). In 1009, a timer may be started, e.g., any time period is possible, for example two (2) seconds. In 1010, the tester determines if the tester is connected to the component. If no, the calculated current is displayed 1011. If yes, the tester determines if the timer has expired. If no, the testers determines if the tester is connected to the component 1010, and repeats as indicated. If yes (timer expired), the tester re-measures the voltage drop and translates the voltage drop into current and displays, 1013. Then the tester determines if the tester is still connected to the component, 1014. If yes, the tester returns to 1013. If no, the tester clears the display, 1015. The timer and its associated steps may be optional and the tester configured to update the current periodically or continuously.

The initial default setting of the pre-determined voltage drop/current relationship in the microprocessor may be set at any value. In one embodiment, the initial default setting may correspond to a 5 Amp fuse. The relationship may be changed, after initialization (e.g., turning the device on) via the input device.

The present invention may be embodied in other forms without departing from the spirit and the essential attributes thereof, and, accordingly, reference should be made to the appended claims, rather than to the foregoing specification, as indicating the scope of the invention.

I claim:

1. A current tester for parasitic current leaks comprising:
   a probe,
   a computing device for converting a voltage drop across a fuse to a current, the voltage drop is associated with the parasitic current leak, said computing device operatively associated with said probe,
   an input device for selecting among multiple fuses types, said input device operatively associated with said computing device, each fuse type having a pre-determined voltage drop/current relationship stored in said computing device, and
   an output device for signaling a presence or non-presence of the parasitic current leak, said output device operatively associated with said computing device.

2. The tester according to claim 1 wherein said fuse being an automotive fuse.

3. The tester according to claim 1 wherein said output device being a visual display of a current value, an audible tone indicating the presence or non-presence of current, or both.

4. The tester according to claim 1 wherein said pre-determined voltage drop/current relationship for said fuse stored in said computing device being: an equation where current is a function of voltage drop, or a look-up table.

5. The tester according to claim 4 wherein said pre-determined voltage drop/current relationship comprising multiple voltage drop ranges.

6. The tester according to claim 1 wherein said probes clip-on said fuse.

7. A method for detecting parasitic current leaks in a circuit comprising the steps of:
   selecting a fuse from multiple fuse types stored in a current tester, each fuse type having a pre-determined voltage drop/current relationship stored in the current tester,
   connecting a current tester to the fuse,
   measuring a voltage drop across the fuse with the current tester, the voltage drop is associated with the parasitic current leak,
   converting the voltage drop to a current via the current tester, and
   producing a signal by the current tester indicating a presence or non-presence of the parasitic current leak in the circuit.

8. The method of claim 7 wherein the circuit is an automotive circuit.

9. The method of claim 7 wherein the fuse is an automotive fuse.

10. The method of claim 7 wherein the signal is a visual display, an audible tone, or both.

11. The method of claim 7 wherein the pre-determined voltage drop/current relationship for the fuse stored in the current tester is an equation where current is a function of voltage drop or a look-up table.

12. The method of claim 11 wherein said pre-determined voltage drop/current relationship comprises multiple voltage drop ranges.

\* \* \* \* \*